United States Patent [19]
Hollenberg et al.

[11] Patent Number: 5,561,071
[45] Date of Patent: Oct. 1, 1996

[54] DNA AND DNA TECHNOLOGY FOR THE CONSTRUCTION OF NETWORKS TO BE USED IN CHIP CONSTRUCTION AND CHIP PRODUCTION (DNA-CHIPS)

[76] Inventors: Cornelis P. Hollenberg, Chopinstrasse 7, 4000, Düsseldorf, Germany; Ernesto di Mauro, Via Andrea Fulvio 10, 00162, Rome, Italy

[21] Appl. No.: 532,542

[22] Filed: Sep. 25, 1995

Related U.S. Application Data

[63] Continuation of Ser. No. 116,556, Sep. 7, 1993, abandoned, which is a continuation of Ser. No. 22,615, Feb. 19, 1993, abandoned, which is a continuation of Ser. No. 552,938, Jul. 16, 1990, abandoned.

[30] Foreign Application Priority Data

Jul. 24, 1989 [DE] Germany ............... 39 24 454.7

[51] Int. Cl.⁶ .................................................. H01L 51/40
[52] U.S. Cl. ...................... 437/1; 435/810; 437/15; 437/16; 437/35; 437/36; 437/38; 437/51; 437/54; 437/80; 437/225; 437/238; 536/22.1; 536/25.3; 935/77; 935/88
[58] Field of Search ................... 435/6, 810, 287, 435/299; 536/22.1, 25.3; 437/1, 15, 16, 35, 36, 38, 51, 54, 80, 225, 238; 935/77, 88

[56] References Cited

U.S. PATENT DOCUMENTS

| | | | |
|---|---|---|---|
| 4,103,064 | 7/1978 | McAlear et al. | 428/333 |
| 4,103,073 | 7/1978 | McAlear et al. | 428/474 |

FOREIGN PATENT DOCUMENTS

| | | |
|---|---|---|
| 3924454 | 2/1991 | Germany. |
| 1472191 | 5/1977 | United Kingdom. |

OTHER PUBLICATIONS

Kornberg *DNA Synthesis* W. H. Freeman & Co. San Francisco Calif p. 75 (1974).
Goodenough *Genetics* Holt Rinehardt & Winston NY NY p. 33, 35, 92–93 (1974).
Hames et al *Nucleic Acid Hybridization* IRL Press Wash D.C. pp. 161–178 (1985).
H. Kabata, et al., "Visualization of Single Molecules of RNA Polymerase Sliding along DNA," Science, vol. 262, pp. 1561–1563 (1993).
R. Zimmerman et al., "DNA Stretching on Functionalized Gold Surfaces," Nucleic Acids Research, vol. 22, pp. 492–497 (1994).
W. Oldham, "The Fabrication of Microelectronic Circuits," Scientific American, vol. 237, pp. 110–128 (1977).
J. Jahanmir, et al., "The Scanning Probe Microscope," Scanning Microscopy, vol. 6, pp. 625–660 (1992).
D. Eigler et al., "Positioning Single Atoms With A Scanning Tunnelling Microscope," Nature, vol. 344, pp. 524–526 (1990).
D. Eigler et al., "An Atomic Switch Realized With The Scanning Tunnelling Microscope," Nature, vol. 352, pp. 600–603 (1991).
A. Oliphant et al., "Defining the Sequence Specificity of DNA–Binding Proteins by Selecting Binding Sites from Random–Sequence Oligonucleotides: Analysis of Yeast GCN4 Protein," Molecular and Cellular Biology, 9:2944 (1989).
C. Cantor et al., "Orientation in Electric Fields," Biophysical Chemistry part II, 665–668 (1980).

(List continued on next page.)

*Primary Examiner*—W. Gary Jones
*Assistant Examiner*—Ardin H. Marschel
*Attorney, Agent, or Firm*—Finnegan, Henderson, Farabow, Garrett & Dunner

[57] ABSTRACT

The invention relates to construction of specific molecular microcircuits by the use of double and single stranded nucleic acids and specific DNA-binding proteins.

7 Claims, 1 Drawing Sheet

OTHER PUBLICATIONS

M. Buongiorno Nardelli et al., "Binding of Sea Urchin RNA polymerase II on Homologous Histone Genes," Eur. J. Biochem, vol. 116, pp. 171–176 (1981).

R. W. Davis et al., "Electron Microscope Heteroduplex Methods for Mapping Regions of Base Sequence Homology in Nucleic Acids," Methods Enzymol. vol. 21, pp. 413–429 (1971).

T. H. Koller et al., "An Electron Microscopic Method for Studying Nucleic Acid–Protein Complexes. Visualization of RNA Polymerase Bound to the DNA of Bacteriophages T7 and T3," Biopolymers, vol. 13, pp. 995–1009 (1974).

M. Sawadogo et al., "RNA polymerase B(II) and General Transcription Factors," Ann. Rev. Biochem., vol. 59, pp. 711–754 (1990).

D. C. Schwartz et al., "New Techniques for Purifying Large DNAs and Studying Their Properties and Packaging," Cold Spring Harbor Symp. Quant. Biol., vol. 47, pp. 189–195 (1982).

K. Kirkegaard et al., "The Cleavage of DNA by Type–I DNA Topoisomerases," Cold Spring Harbor Symp. Quant. Biol., vol. 49, pp. 411–419 (1984).

G. Micheli et al, "An Electron Microscope Study of Chromosomal DNA Replication in Different Eukaryotic Systems," Experimental Cell Research, vol. 137, pp. 127–140 (1982).

Oliphant et al. (1989), Molecular and Cellular Biology, vol. 9, No. 7, pp. 2944–2949.

Trifonov et al., "Inherently Curved DNA and Its Structural Elements," Unusual DNA Structures, Edited by Wells et al., Springer Verlag, New York, pp. 173–187, 1987.

Diekmann et al., "Unique Poly (dA) Poly (dT) B'–Conformation in Cellular an Synthetic DNAs," Nucleic Acids Research, vol. 15, No. 15, pp. 6063–6074, 1987.

Watson et al., "Molecular Biology of the Gene," The Benjamin/Cummings Publishing Company, Inc., 4th Edition, pp. 231–234, 240–253, 286–288, 321, 469–474 and 519–523, 1987.

McLean et al., "The Role of Sequence in the Stabilization of Left–Handed DNA Helices In Vitro and In Vivo," Biochemica et Biophysica Acta 950, pp. 234–254, 1988.

Hurwitz et al., "The Enzymic Incorporation of Ribonucleotides Into Poly–ribonucleotides and the Effect of DNA," Biochemical and Biophysical Research Communications, vol. 3, No. 1, pp. 15–19, Jul. 1960.

Brack, "DNA Electron Microscopy," Critical Reviews in Biochemistry, vol. 10, pp. 113–131, Mar. 1981.

Ferguson et al., "Quantitative Electron Microscopy of Nucleic Acids," Advanced Techniques in Biological Electron Microscopy II, Edited by J. Koehler, pp. 123–135, 1978, Efsratiadis et al., "Enzymatic In Vitro Synthesis of Globin Genes," Cell, vol. 7, pp. 279–288, 1976.

Maniatis et al., "Molecular Cloning, A Laboratory Manual," Cold Spring Harbor Laboratory, (1982) pp. 3–15, 286–291 and 446–447.

Weiss et al., "Enzymatic Breakage and Joining of Deoxyribonucleic Acid," The Journal of Biological Chemistry, vol. 243, No. 17, pp. 4543–4555, Sep. 10, 1968.

Sherman et al., "Laboratory Course Manual for Methods in Yeast Genetics," Cold Spring Harbor Laboratory, pp. 91–103, 1986.

Burke et al., "Cloning of Large Segments of Exogenous DNA into Yeast by Means of Artificial Chromosome Vectors," Science, vol. 236, pp. 806–812, 1986.

Dickerson, "The DNA Helix and How It Is Read," Sci. Am., vol. 249, pp. 87–102, 1983.

Johnson, et al., "Interactions Between DNA–Bound Repressors Govern Regulation by the λ Phage Repressor," Proceedings of the National Academy of Science of USA, vol. 76, No. 10, pp. 5061–5065, Oct. 1979.

McAlear et al., "Biotechnical Electron Devices," Molecular Electronic Devices, Marcel Dekker Inc., New York, pp. 175–178, 1983.

Ulmer, "Biological Assembly of Molecular Ultracircuits," Molecular Electronic Devices, Marcel Dekker Inc., New York, pp. 213–220, 1983.

W. Fiers, "Structure and Function of RNA Bacteriophages," Comprehensive Virology, Chapter 3,, pp. 69 and 94–204.

Van Holde Physical Biochemistry (1971) Prentice–Hall, Inc. Englerwood Cliffs, N.J. pp. 202– 220.

DNA AND DNA TECHNOLOGY FOR THE CONSTRUCTION OF NETWORKS TO BE USED IN CHIP CONSTRUCTION AND CHIP PRODUCTION (DNA-CHIPS)

This application is a continuation of application Ser. No. 08/116,556 filed Sep. 7, 1993, now abandoned, which is a continuation of Ser. No. 08/022,615 filed Feb. 19, 1993, now abandoned, which is a continuation of Ser. No. 07/552,938, filed Jul. 16, 1990, now abandoned.

BACKGROUND OF THE INVENTION

DNA is a polymeric compound which can be manipulated by different physical and enzyme techniques such as denaturation/renaturation, enzymatic synthesis, modification reactions and protein binding. DNA technology (ref.8) allows the construction of self-assembling networks at a ultramicroscopical or monomolecular scale (described below). The nucleic acid networks can be used as masks in photolythographic procedures currently used for the construction and production of computer chips. The networks can be reproduced by molding to produce replicas consisting of other materials or can be used as a scaffold to deposit different materials such as n- doped gallium arsenide or gallium arsenide, able to conduct electric current. So constructed conducting elements can be used as components of electronic chips. The self assembling properties of nucleic acids can be also used to construct switching elements needed for electronic chips.

SUMMARY OF THE INVENTION

The present invention involves a methodology that allows the construction of molecular microcircuits using recombinant DNA technology and related biochemical techniques.

Some advantages of the present invention are:

Miniaturization. The networks form as a consequence of programmed reactions which are determined by the structure of the components of the network, e.g., the base sequence of the nucleic adds. Therefore, their design and production do not depend upon photolythographic reproduction of a large-scale pre-designed network. Thus, the size and precision limits intrinsic to commonly used reproduction procedures are a priori by-passed by our method. The size of the circuits is close to that of the thickness of a single or double-stranded nucleic acid (from 10 to 20 Å) and far below the sizes obtainable at present.

Precision. This is determined by the high precision possible for the reactions of nucleic acid biosynthesis: an average of one error per $10^9$ nucleotides incorporated into a polymeric chain. Furthermore the high specificity of base pairing ensures a high precision of the assembly of the network components. Thus, both the miniaturization and accuracy of the microcircuits obtainable by our DNA chip technology are at least two orders of magnitude higher than that of the normal photolythographic procedure.

In accordance with the purposes of the invention, as embodied and broadly described herein, the invention is a molecular micronetwork for the production of electronic microcircuits, comprising: double stranded nucleic acid molecules whereby a molecular pattern of the micronetwork is formed by specifically synthesized nucleic acid molecules and fixation thereof to specific DNA-binding protein.

In further accordance with the purposes of the invention, as embodied and broadly described herein, the invention is a molecular micronetwork for the production of electronic microcircuits, comprising: single stranded nucleic acid molecules whereby a molecular pattern of the micronetwork is formed by specifically synthesized nucleic acid molecules and fixation thereof to specific DNA-binding proteins.

In further accordance with the purposes of the invention, as embodied and broadly described herein, the invention is a molecular micronetwork for the production of electronic microcircuits, comprising: single stranded nucleic acid molecules whereby a molecular pattern of the micronetwork is formed by hybridization of nucleic acid molecules and fixation thereof to specific DNA-binding proteins.

The advantages of the invention will be set forth in part and is in the description as follows and in part will be obvious from the description or may be learned by practice of the invention. The advantages of the invention will be realized and attained by means of the elements and combinations particularly pointed out in the appended claims.

BRIEF DESCRIPTION OF THE DRAWINGS

The accompanying drawing, which are incorporated in and constitute a part of the specification, illustrate several embodiments of the invention and, together with the description, serve to explain the principles of the invention.

DETAILED DESCRIPTION OF THE PREFERRED EMBODIMENTS

Figure 1:
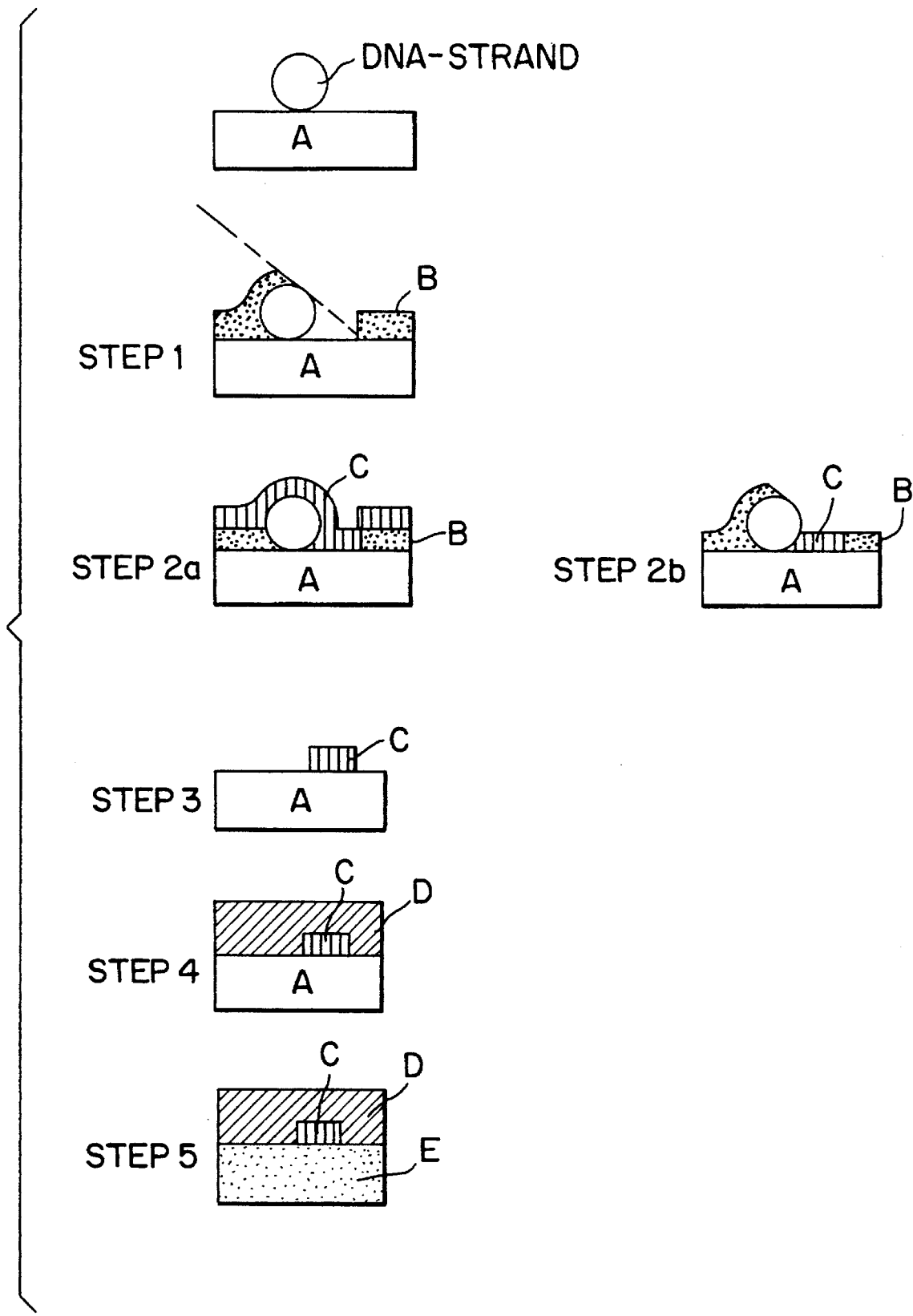
FIG. 1 shows the steps in the shadowing technique to build a microcircuit.

We describe, in the following order, the principles (and relevant examples) underlying the construction of micropatterns and their use as electronic chips.
I Construction of nucleic acid networks
II The conversion of nucleic acid or nucleic add-protein networks to an electricity-conducting network.
III The nucleic acid or nucleic add-protein networks described in I and II can also be used for a photolithographic reproduction method using the DNA network as a mask.

I CONSTRUCTION OF NUCLEIC ACID NETWORKS

1. Construction of initiation point (DWIP) and end point (DWEP) of the DNA wire.

A network made up of nucleic acids consists of a DNA wire initiation point (see sect.1a below), of an intermediate part (see sect. 1b, 1c and 2–4 below), of a DNA wire end point (see sect. 1c below). The complexity of the intermediate part can be programmed and can consist of branch points, switches and multistranded DNA regions (see sect.2 below).

a. DNA wire initiation point.

A DWIP (DNA Wire Initiation Point) is constructed by use of a DNA double strand having a blunt end at one extremity and a sequence specific single stranded extension at the other end such that only one end is a substrate for DNA elongation by synthesis or hybridization.

Outline 1

An oligonucleotide with the following sequence can be synthesized in vitro:

3'TTAACTGAACTAGAGAACGTCTAGTTCAGTTAACT—
ATTTTGGAAGCGTAGCTTCCACTAATCCT5'    (1)

3' and 5' indicate the 2 extremities of the nucleic acid strand. The enzymatic polymerization of DNA by the enzyme DNA polymerase (ref.7) proceeds by addition of monomers to the 3'-extremity (see ref.1). The letters G,A,C,T are acronyms that indicate the monomeric constituents of the DNA strand; they are nucleotide monophosphates containing respectively a purine (guanine for G, adenine for A) or a pyrimidine (cytosine for C,, thymine for T) residue. In DNA polymers these compounds can base pair specifically: G couples always with C, A with T. Therefore a self-annealing reaction in a solution containing the appropriate buffer (2x SSC solution, ref.8 p.447) at 20° C. will produce the molecule.

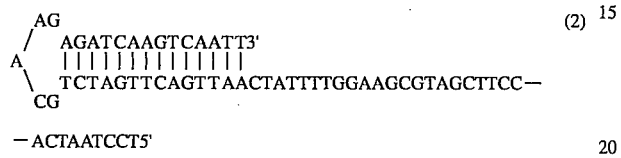
(2)

— ACTAATCCT5'

The left extremity of molecule (2) is the DWIP, the right extremity is the growing point (that is the point onto which additional hybridization or synthetic reactions can be performed in order to elongate the chain and/or create branch points or switches. Elongation may be obtained by hybridization of a preformed DNA molecule or a reaction of DNA synthesis. Hybridization of nucleic acids is a procedure that exploits the tendency of nucleic acids to anneal to double strand structures (according to the rules mentioned above: A with T, G with C), if the complementary order of the nucleotides that compose the DNA sequence permits it.

One synthesizes according to the procedure mentioned above the following molecule:

(3)

The hybridization reaction between molecules (2)+(3) will produce molecule (4):

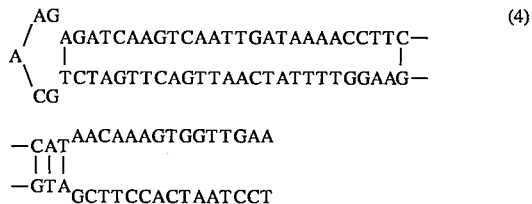
(4)

This molecule produced by synthesis and hybridization has one DWIP (left) (defined above as "blunt end") and a branched extremity (right). This branched extremity now provides two different growing points that can be used for further elongation and branching of the molecule, to produce a network (Scheme 1)). Many DNA sequences can lead to the shown below structure. The length is variable.

Scheme 1:

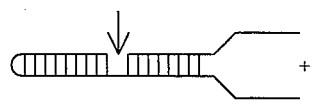

Scheme 1:

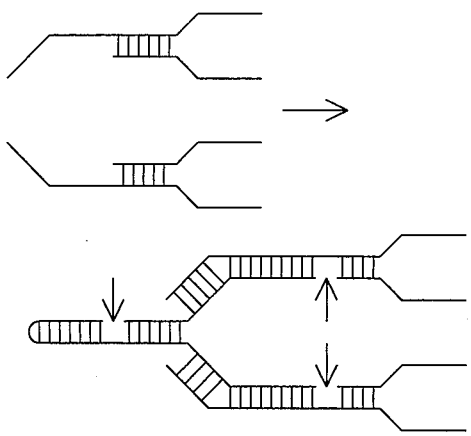

Single strand interruptions in the DNA strands (indicated in Scheme 1 by the arrows), can be easily filled up by the reaction of the enzyme DNA ligase (commercially available, i.e., from Bethesda Research Laboratories, Boehringer Mannheim, etc, see refs. 8,9). The synthesis of oligonucleotides (molecules 1 and 3) can be performed with commercially available apparatus (i.e., from Applied Biosystems or New Brunswick Scientific Company).

The DWIP can be fixed to a solid matrix by several techniques e.g., locally fixed charged molecules or sequence specific DNA binding proteins (as bacteriophage DNA binding proteins, Adenovirus binding protein, lac repressor or synthetic DNA binding proteins) or covalent chemical binding.

Outline 2

A DNA molecule such as molecule (4) described in outline 1 can be fixed by the following procedure to a matrix onto which the nucleic acid network will be formed:

(i) Place, by the use of a micromanipulator, a microdrop of a solution of a specific protein (i.e. lambda-protein repressor; see below) on a hydrophobic surface like polyethylene and let it dry.

(ii) Synthesize a molecule (5) which contains the sequence (4) and (6) in such an arrangement that sequence 6 is located at the left end of the self-annealed double strand structure:

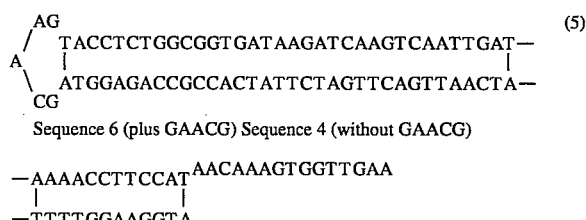
(5)

Sequence 6 (plus GAACG) Sequence 4 (without GAACG)

—AAAACCTTCCAT<sup>AACAAAGTGGTTGAA</sup>
 |           |
—TTTTGGAAGGTA<sub>GCTTCCACTAATCCT</sub>

(iii) Treat the hydrophobic surface with a solution of DNA molecule (5). The specific binding of the DNA molecule to the protein molecule is ensured by the use of the specific DNA-protein interaction. Specificity of such interaction is a well-known phenomenon in biological processes and several DNA-protein interaction systems can be chosen, as detailed in the following paragraph.

Repressors are proteins which regulate gene expression, well described for bacteria and bacteriophages systems (ref.11). These proteins interact with DNA with extreme, sequence-determined specificity. A sequence 12–20 nucleotides long is sufficient to determine an absolutely selective DNA-protein interaction. For instance: lambda repressor binds to the DNA sequence:

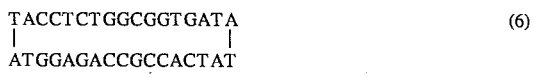  (6)

lac repressor binds to the DNA sequence:

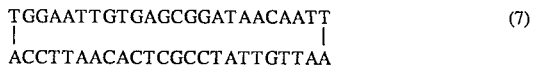  (7)

(iv) Thus the λ-repressor molecule fixed to the polyethylene surface will bind a specific DNA molecule (5) with high affinity and stability dissociation constant of the order of $K_m = 10^{-13}M$).

(v) An alternative procedure for sequence-specific fixation of polymeric DNA molecules is based on the properties of specific interaction of homogeneous repetitive polynucleotides, such as GAAGAAGAA ... or ... TTTTTTTT ... or ... GCGCGCGC .  (8)

with oligopeptides made of repetitions of amino adds, such as polylysine, polythreonine, etc.

Specific interaction of oligonucleotides and oligopeptides is common knowledge.

As described above, the DNA in the DWIP can consist of complementary strands which bind specifically to the appropriate protein (see above).

b. Extension of the DWIP.

The right extremity of the DNA molecule (5) is bifurcated and offers two growing points, which can be elongated by hybridisation of a presynthesized or naturally specific DNA strand of a given length and/or by DNA synthesis.

c. DNA wire end point (DWEP).

Construction of a connection between two fixed points.

The DWEP is constructed in a fashion similar to the DWIP. The extension reactions as described for the DWIP can also be applied to the DWEP leading to a connection in between the DWIP and DWEP. The connection can be obtained by hybridization of sequence-specific nucleic add strands. Alternatively, the extension of the DWIP can be designed to be connected directly to the DWEP by specific hybridization of a defined DNA strand.

EXAMPLE 1

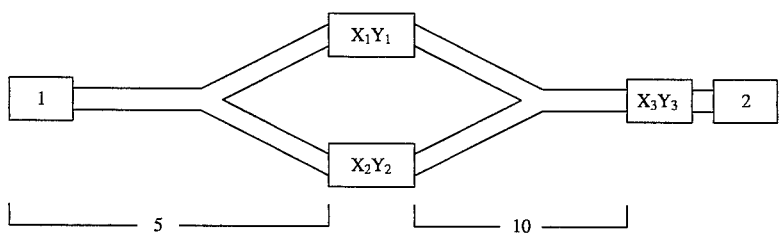

(9)

In the above scheme (9) molecule (5) serves as DWIP: Block 1 symbolizes the DNA sequence that binds specifically the lambda repressor;block 2 symbolizes the specific lac repressor binding sequence; the symbols X1Y1, X2Y2, X3Y3 indicate any sequence of any length or any composition, chosen according to the complexity requirement of the micropattern (see below). These intermediate sequences can be easily synthesized in vitro with state of art DNA technology or can be prepared from DNA of biological origin (see below). Sequence 10 is built up as sequence (5) but with an other DNA sequence.

In order to obtain a fixed DNA pattern, the following operations are required:

1) Synthesize a DWIP (i.e. molecule (5))
2) Bind it to a fixed lambda repressor molecule, as described
3) Synthesize a DWEP, as described, e.g., at the right extremity of molecule (9)
4) Bind it to a fixed lac repressor molecule, as described for the lambda repressor
5) The required intermediate series of DNA molecules above indicated as X1Y1 and X2Y2 are annealed by standard DNA-DNA hybridization procedures to both the DWIP and DWEP. DWIP and DWEP will be located, on a hydrophobic surface, at a distance corresponding to the length of the intermediate part (i.e. for an intermediate of a linear length of 3000 nucleotides, the DWIP and DWEP are 1μ apart).

2. Construction of branch points switches and multistranded regions to be used in DNA wires.

The programming of synthesis of defined DNA sequences, joining them by sequence specific hybridization and—if wanted—the sealing of the single stranded interruptions in the double strands so obtained, offers the possibility of constructing at will any shape of network.

EXAMPLE 2

The following constructions are performed 1) a double stranded DNA molecule (10) ending with two protruding single strand sequences

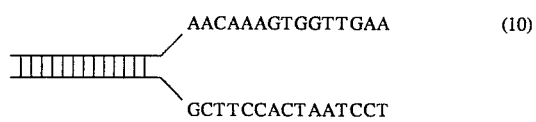  (10)

2) a double stranded molecule (11) ending with two protruding single strand sequences complementary to those of (10):

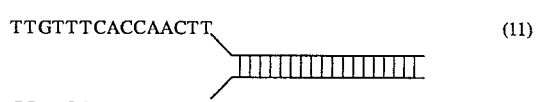  (11)

3) Molecules 10 and 11 are annealed which leads to a double stranded loop (12)

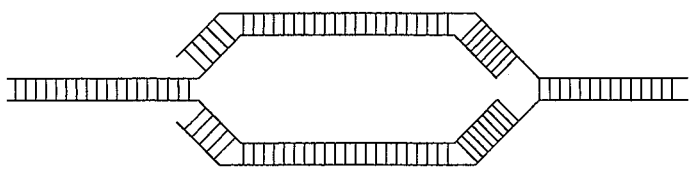

(12)

Both molecules (10) and (11) can be fixed to a matrix as described for DWIP and DWEP. The length and sequence of each branch can be varied at will. The resulting electronic properties (see below) can therefore be fixed in a preprogrammed fashion. One or both branches can contain specific binding sites for proteins. The binding of the protein allows a change in the electronic properties of the resulting network. Protein-DNA binding systems can be used which only bind under certain electronic conditions in the DNA strands thereby enabling the function of a switching element.

3. Defined DNA length or amount.

DNA is available in defined amounts, sizes, and composition, e.g., in the form of plasmids, viral genomes or synthetic DNA. These units can be used for the construction of DNA elements requiring a defined amount of DNA of a defined composition. A unit bound at a specific point determined by the DNA sequence can give desired properties as, e.g., a contact point.

4. DNA-protein complexes.

Specific combinations of DNA sequences and DNA binding proteins can be used to construct functional parts in a network, e.g., a pox virus genome has a protein bound specifically at its extremity (ref.1). This protein can be used to bind the terminal DNA fragment at a matrix. Furthermore many regulatory proteins with specific binding properties such as lac-repressor, λ-repressor etc. are known. Alternatively, polypeptides can be synthesized to bind at specific DNA sequences. In addition modified nucleotides reacting with specific antibodies can be positioned at the end of a DNA molecule, i.e., DNA sequences that form left-handed DNA and react with specific antibodies (ref.2).

Specific polypeptide—DNA complexes can be used to fix DNA fragments, e.g., to a matrix or to other DNA molecules. In addition or alternatively, antibodies can be used to stick DNA- protein complexes to other compounds or surfaces. DNA- protein complexes can also be used to change local electric conductance properties.

5. Use of RNA.

Sequence-specific RNA can be synthesized in vitro on programmed DNA templates (ref.3). The properties of RNA differ from those of DNA. Additionally, RNA can assume, by intrastrand hybridization, any designed secondary structure, such as hairpin-like structures (ref.4), thus offering additional possibilities of modulation of electric conductivity. Mixed RNA-DNA networks can be easily obtained by programming the order of the hybridization (or synthesis) reactions used to construct the connections between DWIP and DWEP.

6. Further examples

EXAMPLE 3

Simplified protocol for the physical orientation of a DNA double strand to be used as a mold, scaffold or a mask for construction of chips:

Step 1: Construct a DWIP with a micromanipulator on a hydrophobic surface such as polyethylene by using a microdrop of a λ-repressor solution and letting it dry.

Step 2: Construct a DWEP as in step 1, 50 micrometer apart from the DWIP, using an *E. coli* lac-repressor solution.

Step 3: Prepare a plasmid DNA molecule (ref.8) carrying both the lac operator and the λ-operator.

Since both operators can be integrated at any desired distance within a plasmid; DNA molecules of the desired length carrying terminal operators can be produced by using standard recombinant DNA techniques. Using bacteriophage T4 DNA the size of the bridge molecule could can be as long as 165 kb, whereas a small artificial plasmid that can be amplified in *E. coli* could be as short as 1 kb. Larger molecules can also be replicated and prepared in the yeast *Saccharomyces cerevisiae* as minichromosomes (ref.13).

Step 4: Treat the hydrophobic surface with a solution containing this DNA. One DNA molecule will bind selectively and directionally to DWIP and DWEP.

EXAMPLE 4

Construction of shorter bridges can use cosmid vectors. Short description: restrict cosmid vector DNA. Ligate with DNA of about 49 kb (approx. 15 μm) which contains at one extremity a lac operator and at the other end a λ-operator. The construction is obtained by standard genetic engineering procedures (ref.8): Packaging the ligated DNA in vitro, transformation of *E. coli*, normal selection and ampli fication procedures (ref.8). Use this DNA in the scheme described for example 3, starting from step 3. Distance from DWIP and DWEP= 15 micrometer.

EXAMPLE 5

Larger bridges between DWIP and DWEP may be constructed by using *E. coli* chromosomal DNA with specifically inserted lysogenic phage DNA or by recombination inserted DNA segments. Larger defined DNA segments can also be constructed and produced in the yeast *Saccharomyces cerevisiae* by the use of plasmids (ref.12) or artificial chromosomes (ref.13). Such DNA molecules carry both λ-operator and lac operator DNA sequences, spaced by any desired distance within the DNA element used. Therefore, these DNA molecules can bridge a broad spectrum of distance between DWIP and DWEP, from few nucleotides to more than 1 mm (the length of the linearized *E. coli* chromosome) or more mm (the length of a yeast chromosome). Use the constructed DNA molecules as described in example 3, starting from step 3.

II CONVERSION OF A NUCLEIC ACID OR NUCLEIC ACID-PROTEIN NETWORK TO AN ELECTRONIC MICROCIRCUIT

The DNA networks can be used as molds or scaffolds to produce replicas consisting of other materials. The replicas can be made as MOSFETS (metal oxide semiconductor field effect transistors), MESFETS (metal semiconductor FETS), and MODFETS (modulation FETS) by depositing in various orders different materials in selected sequences:

A) Use of shadowing technique to deposit the conductor. The building principle is based on the construction of a molecular nucleic acid network (as described in I) on a support of substrate A of defined chemical characteristics allowing to perform the following steps:

1) Shadow (low-angle) the network with substance B using techniques currently practised for the preparation of DNA for EM (ref.5,6) but without rotation leading to an uncovered track along the nucleic acid (step 1 FIG. 1). The substrate is tilted by a small value angle relative to the gas flow direction in order to obtain an empty shadow which follows the track defined by the DNA (refs.5,6).

2) Deposit a layer of substance C, e.g., doped gallium arsenide, doped silicon, or a similar conductor by electrical or chemical deposition only at the uncovered track along the nucleic acid pattern.

3) Remove substance B and DNA leaving the conductor pattern free step 3 of FIG. 1.

4) Deposit a second conductor D, e.g., gallium arsenide, by metallo-organic chemical vapor deposition method (MOCVD) step 4 of FIG. 1.

5) If desired remove substance A and replace by another support, substance E step 5 of FIG. 1.

This procedure leads to the substitution of a molecular nucleic acid/protein pattern by the conductor C embedded in the conductor D.

B) Alternatively, electric or chemical deposition of the conductor C directly onto the nucleic acid network. Continue with step 5 (step 5 of FIG. 1).

III PHOTOLITHOGRAPHIC REPRODUCTION METHOD USING THE DNA NETWORK AS A MASK

In standard manufacturing procedures of microelectronic circuits, large patterns are made and then photographically placed in reduced form on the chip. In these standard procedures a circuit is designed and used to prepare a set of final-size master masks, which are then reproduced on chips. The DNA networks can be used directly as master masks for the manufacture of microelectronic circuits, avoiding size-reduction intermediate procedures, i.e., the DNA or DNA-protein patterns can be used directly as photomasks in the step of the photolithographic procedure in which the oxidised wafer (silicon dioxide or similar) coated with a layer of a light sensitive material is exposed to ultraviolet light through the photomask (in this case, through the DNA). Also in this case, the network can be changed by deposition or exchange into a network of another material as described under Section II.

REFERENCES (1) J D Watson et al. Molecular biology of the gene, Chap. 9, p. 240–281 and refs therein. The Benjamin/Cumming Publ Comp Inc. 4th Ed. (1987).
(2) M J McLean and R D Wells (1988) The role of sequence in the stabilization of left-handed DNA helices in vitro and in vivo. Biochim Biophys Acta 950, 243–254.
(3) J Hurwitz, A Bresler and R Dizingen (1960) The enzymatic incorporation of ribonucleotides into polynucleotides and the effect of DNA. Biochem Biophys Res Comm 3, 15–19.
(4) W Fiers (1979) Structure and function of RNA. Bacteriophages Comp Virology 13, 69.
(5) C Brack (1981) DNA electron microscopy. CRC Critical Reviews in Biochemistry 10, 113–169.
(6) J Ferguson and R W Davis (1978) Quantitative electron microscopy of nucleic acids. In: Advanced Techniques in Electron Microscopy 2, 123–171. Ed. I. Koehler, Springer, N. Y.
(7) A Efstratiadis, A M Kafatos, A M Maxam and T Maniatis (1976) Enzymatic in vitro synthesis of globin genes. Cell 7, 279.
(8) T Maniatis, E F Fritsch and J Sambrook. Molecular Cloning, A Laboratory Manual. Cold Spring Harbor, USA. Laboratory Press, N.Y. (1982).
(9) B Weiss et al. (1968) Enzymatic breakage and joining of deoxyribonucleic acid. J Biol Chem 243; 4543.
(10) A D Johnson, B I Meyer and M Ptashne (1979) Interaction between DNA-bound repressors govern regulation by lambda phage repressors. Proc Natl Acad Sci 76, 5061.
(11) J D Watson et al. Molecular Biology of the Gene. Chap.16 & 17. The Benjamin/Cummings Publ Com Inc., 4th Ed. (1987)
(12) F Sherman, G R Fink and J B Hicks. Laboratory Course Manual for Methods in Yeast Genetics, Cold Spring Harbor Laboratories, USA (1986).
(13) D T Burke, G F Carle and M V Olson (1986) Science 236, 806–812.

We claim:

1. A method for the production of a nucleic acid chip which method comprises:

(a) providing a substrate;

(b) depositing onto said substrate two or more sequence-specific DNA-binding proteins in a predetermined deposition pattern having beginning and ending points; and (c) attaching to the predeposited proteins on the substrate by site-specific deposition and orientation a preconstructed nucleic acid sequence such that the beginning of said sequence attaches to said beginning point protein and the ending of said sequence attaches to said ending point protein to construct a network in said chip.

2. A method according to claim 1 wherein the nucleic acid chip produced is an electronic microcircuit.

3. A method according to claim 1 wherein the network further comprises nucleic acid formed by DNA and RNA synthesis reactions and hybridization to the preconstructed nucleic acid sequence.

4. A method according to claim 1 which further comprises depositing electrically conductive substances onto the network.

5. A method according to claim 1 further comprising (a) shadowing under low angle with a masking substance so that the substrate stays free of shadow under and one side of the nucleic acid sequences of the network; and (b) depositing a metallo-organic chemical vapour using electron conductive material such as doped gallium arsenide and doped silicon on the track which remains free from the masking substance under and/or beside said nucleic acid sequences of the network.

6. A method for the construction of a mask for the production of a nucleic acid chip by a photolithographic procedure, comprising the steps:

(a) producing a nucleic acid chip according to claim 1; and (b) shadowing under low angle with a masking, electron dense substance so that the substrate stays free of shadow under and beside the nucleic acid sequences of the network.

7. A method for the construction of a mask for the production of a nucleic acid chip by a photolithographic procedure, comprising the steps:

(a) producing a nucleic acid chip according to claim 1; and (b) converting the network in said chip into an electron dense substance.

* * * * *